US006770163B1

(12) United States Patent
Kuah et al.

(10) Patent No.: US 6,770,163 B1
(45) Date of Patent: Aug. 3, 2004

(54) MOLD AND METHOD FOR ENCAPSULATION OF ELECTRONIC DEVICE

(75) Inventors: Teng Hock Kuah, Singapore (SG); Shu Chuen Ho, Singapore (SG); Charles Joseph Vath, III, Singapore (SG); Loon Aik Lim, Singapore (SG); Man Ho Hui, Singapore (SG); Juay Sim Koh, Singapore (SG)

(73) Assignee: ASM Technology Singapore PTE LTD, Singapore (SG)

( * ) Notice: Subject to any disclaimer, the term of this patent is extended or adjusted under 35 U.S.C. 154(b) by 87 days.

(21) Appl. No.: 10/129,258

(22) PCT Filed: Sep. 8, 2000

(86) PCT No.: PCT/SG00/00140

§ 371 (c)(1),
(2), (4) Date: May 2, 2002

(87) PCT Pub. No.: WO02/20236

PCT Pub. Date: Mar. 14, 2002

(51) Int. Cl.[7] .......................... B29C 45/14; B29C 70/78; B29C 33/42

(52) U.S. Cl. ............. 156/245; 264/272.15; 264/272.17; 425/116; 425/121; 438/107; 438/118

(58) Field of Search .......................... 156/245; 264/250, 264/254, 259, 267, 271.1, 272.11, 272.15, 272.17, 328.4, 328.5; 425/116, 121, 129.1, 544; 438/107, 118

(56) References Cited

U.S. PATENT DOCUMENTS

| | | | | |
|---|---|---|---|---|
| 4,822,550 A | * | 4/1989 | Komathu | 264/263 |
| 4,890,152 A | * | 12/1989 | Hirata et al. | 257/666 |
| 5,218,759 A | * | 6/1993 | Juskey et al. | 29/840 |
| 5,656,549 A | * | 8/1997 | Woosley et al. | 438/118 |
| 5,958,466 A | * | 9/1999 | Ong | 425/127 |
| 6,126,885 A | * | 10/2000 | Oida et al. | 264/511 |
| 6,258,314 B1 | * | 7/2001 | Oida et al. | 264/511 |
| 6,403,387 B1 | * | 6/2002 | Wensel | 438/15 |
| 6,583,504 B2 | * | 6/2003 | Wensel | 257/712 |

* cited by examiner

Primary Examiner—Angela Ortiz
(74) Attorney, Agent, or Firm—Ostrolenk, Faber, Gerb & Soffen, LLP

(57) ABSTRACT

A mold (1) is for molding a one-sided encapsulated electronic device. The mold (1) includes a first mold section (2) defining a mold cavity (4), and a second mold section (3) including a first recessed portion (6) adapted to receive a layer of material (15) attached to a leadframe (10), but not the leadframe (10).

18 Claims, 2 Drawing Sheets

MOLD AND METHOD FOR ENCAPSULATION OF ELECTRONIC DEVICE

Figure 1:
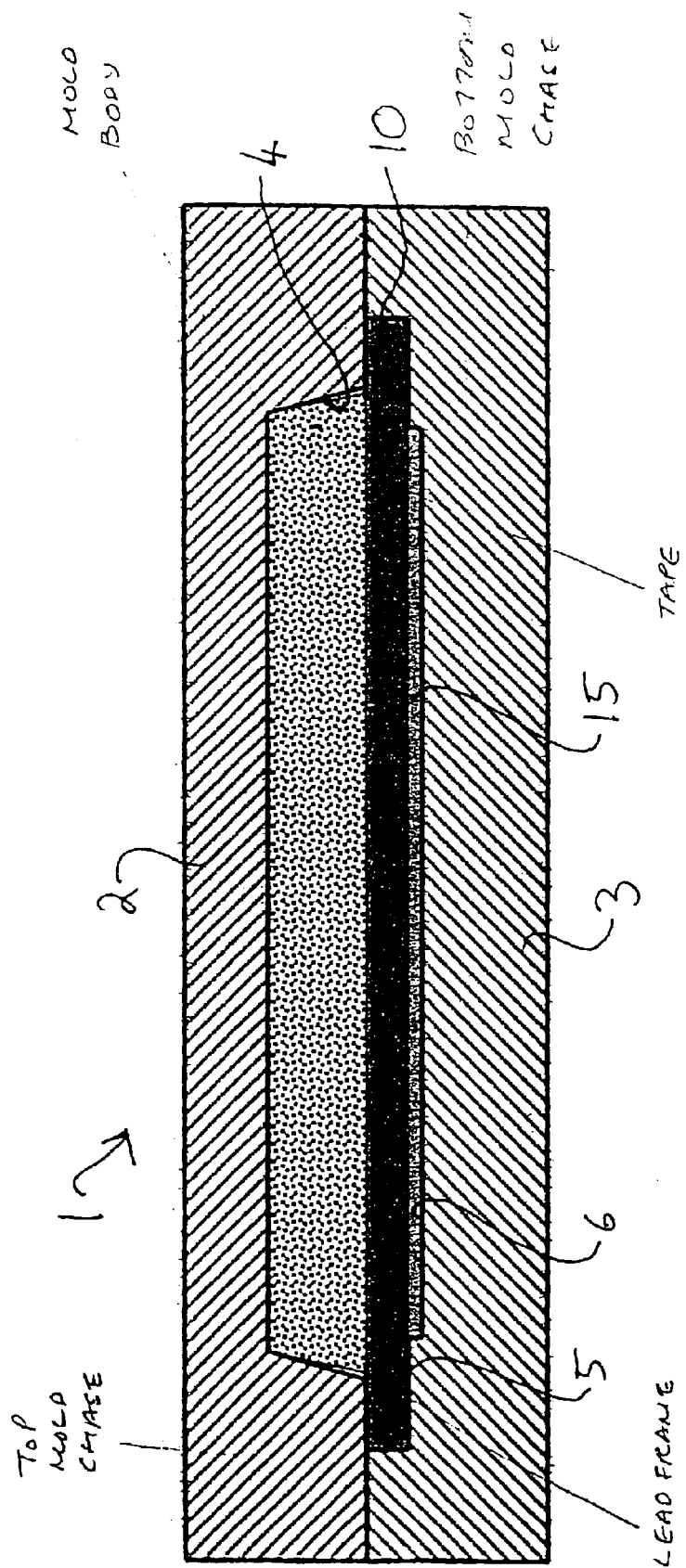

The invention relates to a mold, and in particular, a mold for encapsulating an electronic device.

Conventionally, electronic devices, such as silicon chips (or dies) are assembled by attaching the die to a die attach pad of a leadframe, bonding gold wires between bond pads on the die to corresponding leads on the leadframe and then encapsulating the die, die pad and wires in a resin material so that only the external leads of the leadframe project from the encapsulated package.

In recent years, electronic devices have been developed in which only the side of the leadframe to which the die is attached and the wire bonds are encapsulated leaving the other side of the leadframe free of resin. Such one-sided encapsulated electronic devices are known by a number of different names, including molded leaded packages (MLP), micro leadframe packages (MLF) and quad flat non-leaded packages (QFN).

However, one of the problems with one-sided encapsulated devices is to ensure that during the molding process, the resin covers only one side of the leadframe and does not flow onto the other side of the leadframe. If the resin flows onto the other side of the leadframe, this can result in a defect on that particular device resulting in the device having to be rejected.

One solution to minimising this problem has been to apply adhesive tape to the opposite side of the leadframe from the die side and to then attach the dies and perform the wire bonding, followed by the molding process. The theory behind the use of the tape is that the presence of the adhesive tape on the other side of the leadframe prevents seepage of the resin during molding onto the portion of the leadframe that will become the external leads, thereby reducing the number of devices that have to be rejected.

However, in practice, it is found that resin still flows onto the other side of the leadframe despite the presence of the adhesive tape. This is especially the case with matrix leadframes where the outside row of chips is particularly prone to resin seepage. Hence, it is common practice not to attach dies to the outside row of die attach portions as the probability of resin seepage on the outer row is relatively high.

Therefore, the seepage of resin to the other side of the leadframe reduces the yield of usable chips from a given leadframe.

In accordance with a first aspect of the present invention, a mold for molding a one-sided encapsulated electronic device comprises a first mold section defining a mold cavity, and a second mold section including a first recessed portion adapted to receive a layer of material attached to a leadframe, but not the leadframe.

In accordance with a second aspect of the present invention, a method of encapsulating a one-sided electronic device comprises forming a leadframe assembly by attaching a layer of material to one side of a leadframe, attaching a die to a die attach portion on the other side of the leadframe, bonding wires between contact portions on the die and contact portions on the leadframe, inserting the leadframe assembly into a mold with the die in a mold cavity in a first section of the mold and the leadframe being located on a second section of the mold with the layer of material, but not the leadframe, being located in a first recessed portion of the second section of the mold.

Typically, at least one dimension of the layer of material is smaller than the corresponding dimension of the leadframe. Preferably, the width of the layer of material is smaller than the width of the leadframe.

Preferably, the depth of the first recessed portion is greater than the thickness of the layer of material. Typically, the first recessed portion has a depth which is approximately 10% to 30% greater than the layer of material, preferably 15% to 30% greater, more preferably, 20% to 30% greater and most preferably, approximately 25% greater than the thickness of the material.

Typically, the leadframe is located in a second recessed portion of the second section of the mold, and the first recessed portion is located within the second recessed portion.

Preferably, the layer of material is an adhesive film that is attached to the leadframe by the adhesive. Typically, the adhesive film may be in the form of an adhesive tape. Preferably, the adhesive tape is a polyimide tape with a silicon adhesive, such as Nitto Denko TRM-6250 adhesive tape.

Figure 2:
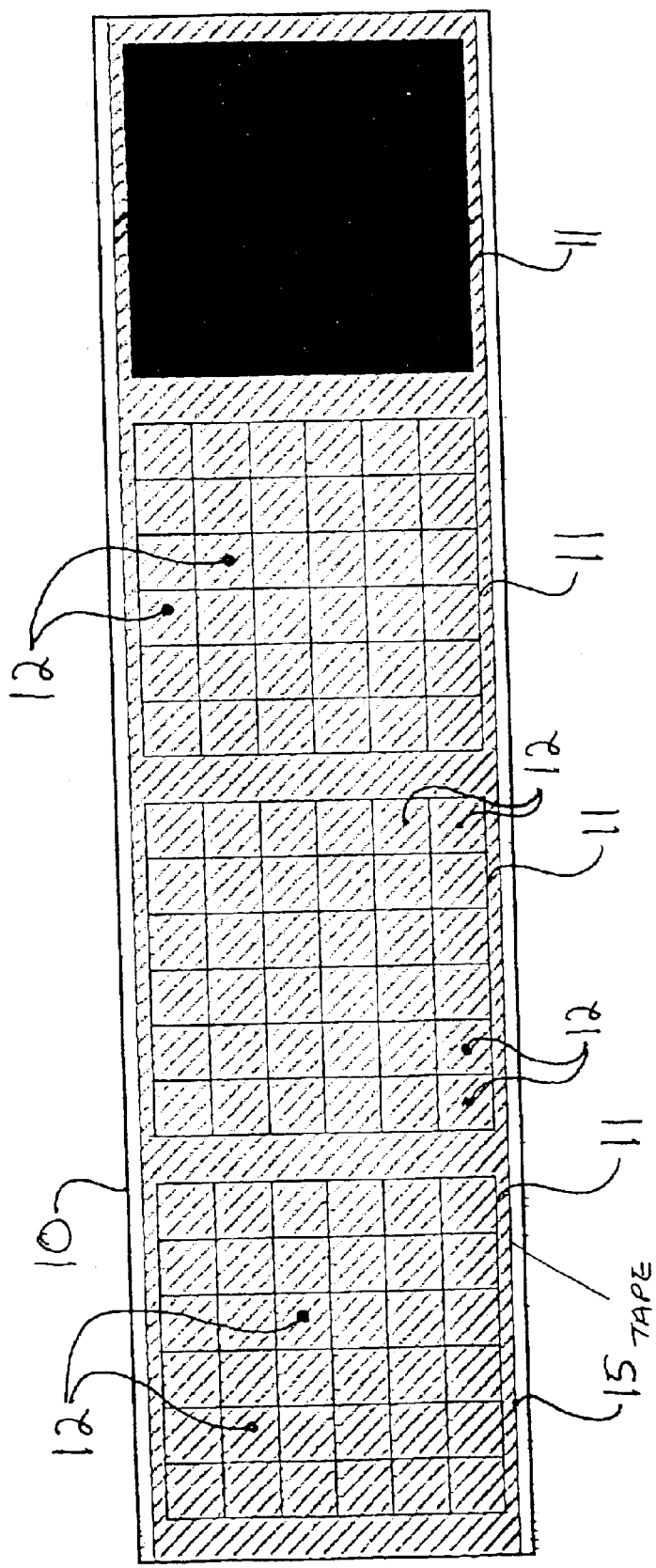

An example of a mold in accordance with the invention will now be described with the accompanying drawings, in which:

FIG. 1 is a cross-sectional view of a mold with a leadframe located in the mold after molding but before separation of the mold; and FIG. 2 is a plan view of a matrix leadframe with adhesive tape attached and one of the matrix blocks molded.

FIG. 1 shows a mold 1 which includes a first mold section 2 and a second mold section 3. The first section of the mold 2 includes a mold cavity 4 and the mold section 3 includes a first recess 6 and a second recess 5. The first recess 6 is located within the second recess 5.

FIG. 2 is a plan view of a matrix leadframe 10 which includes four separate matrixes 11 of die attach pads 12. Each die attach portion 12 can have a die (not shown) attached to it.

In use, an adhesive tape 15 is applied to the underside of the leadframe 10. That is the side opposite to the side on which the dies are to be attached. This is also shown in FIG. 1. Typically, the adhesive tape 15 is a pressure sensitive adhesive tape and is preferably a polyimide tape with silicon adhesive, such as Nitto Denko TRM-6250. After the tape is applied to the underside, dies are attached to each of the die attach pads 12.

After all the dies are attached to each of the die attach pads 12 on each of the matrixes 11, the leadframe 10 is forwarded to a conventional wire bonding machine (not shown). The wire bonding machine bonds wires between bond pads on each individual die attached to a pad 12 and corresponding leads on the leadframe 10.

As shown in FIG. 2, the width of the tape 15 is less than the width of the leadframe 10. Typically, the thickness of the tape 15 is also less than the thickness of the leadframe. For example, the tape may have a thickness of the order of 30 $\mu$m to to 35 $\mu$m.

The first recess 6 in the second mold section 3 preferably has a depth that is greater than the thickness of the tape 15. Typically, the depth of the first recess 6 is approximately 10% to 30% greater than the thickness of the tape, preferably, 20% to 30% greater and most preferably approximately 25% greater. For example if the tape thickness is approximately 30 $\mu$m to 35 $\mu$m, the depth is 5 $\mu$m to 8 $\mu$m greater than the thickness of the tape and most preferably, the depth is approximately 5 $\mu$m greater than the thickness of the tape 15. Typically, if the adhesive tape used is Nitto Denko TRM-6250, the nominal tape thickness is approximately 33 $\mu$m and the depth of the first recess 6 is approximately 38 $\mu$m.

As shown in FIG. 1, with the leadframe 10 inserted in the mold 1, the leadframe 10 is positioned in the second section 3 of the mold 1 such that the leadframe 10 is located in the second recess 5. The tape 15 locates within the first recess 6.

Surprisingly, the inventors have discovered that by providing a first recess 6 which is large enough to receive the tape 15 but too small to receive the leadframe, seepage of resin through to the underside of the leadframe 10 is reduced compared to conventional molds which do not have a first recess 6. The performance of the invention may be further enhanced by preferably making the depth of the first recess 6 greater than the thickness of the tape 15.

What is claimed is:

1. A mold for molding a one-sided encapsulated electronic device from a leadframe, a layer of material being attached to one side of the leadframe, the mold comprising:

a first mold section defining a mold cavity; and a second mold section, the first and second mold sections configured to receive the leadframe therebetween for molding the one-sided encapsulated electronic device, the second mold section including a first recess sized to receive the entire layer of material attached to the leadframe and sized smaller than the leadframe so that the leadframe extends over the first recess without being received within the first recess.

2. A mold according to claim 1, wherein the second mold section includes a second recess sized to receive the entire leadframe, the first recess being located within the second recess.

3. A mold according to claim 1, wherein the layer of material has a thickness and the first recess has a depth that is greater than the thickness of the layer of material.

4. A mold according to claim 3, wherein the depth of the first recess is approximately 10% to 30% greater than the thickness of the layer of material.

5. A mold according to claim 4, wherein the depth of the first recess is approximately 15% to 30% greater than the thickness of the layer of material.

6. A mold according to claim 5, wherein the depth of the first recess is approximately 20% to 30% greater than the thickness of the layer of material.

7. A mold according to claim 6, wherein the depth of the first recess is approximately 25% greater than the thickness of the layer of material.

8. A method of forming a one-sided encapsulated electronic device, comprising:

forming a leadframe assembly by:
    (i) attaching a layer of material to one side of a leadframe, the leadframe including contact portions,
    (ii) attaching a die to a die attach portion of the leadframe on another side of the leadframe, the die including contact portions, and
    (iii) bonding wires between the contact portions of the die and the contact portions of the leadframe;

inserting the leadframe assembly into a mold, the mold including a first mold section defining a mold cavity, and a second mold section including a first recess sized to receive the entire layer of material attached to the leadframe and sized smaller than the leadframe so that the leadframe extends over the first recess without being received within the first recess; and inserting a molding material into the mold cavity of the first mold section to form the one-sided encapsulated electronic device.

9. A method according to claim 8, wherein the layer of material has a thickness and the first recess has a depth that is greater than the thickness of the layer of material.

10. A method according to claim 9, wherein the depth of the first recess is approximately 10% to 30% greater than the thickness of the layer of material.

11. A method according to claim 10, wherein the depth of the first recess is approximately 15% to 30% greater than the thickness of the layer of material.

12. A method according to claim 11, wherein the depth of the first recess is approximately 20% to 30% greater than the thickness of the layer of material.

13. A method according to claim 12, wherein the depth of the first recess is approximately 25% greater than the thickness of the layer of material.

14. A method according to claim 8, wherein a thickness of the layer of material is from 15 $\mu$m to 60 $\mu$m.

15. A method according to claim 14, wherein the thickness of the layer of material is from 30 $\mu$m to 40 $\mu$m.

16. A method according to claim 8, wherein the second mold section of the mold includes a second recess sized to receive the leadframe, the first recess of the second mold section being located with the second recess of the second mold section, the leadframe assembly being inserted into the mold such that the leadframe is located entirely within the second recess.

17. A method according to claim 8, wherein the layer of material is an adhesive film having an adhesive, the layer of material being attached to the leadframe via the adhesive.

18. A method according to claim 17, wherein the adhesive film is an adhesive tape.

* * * * *